(12) United States Patent
Pelley

(10) Patent No.: US 8,872,578 B1
(45) Date of Patent: Oct. 28, 2014

(54) SELF ADJUSTING REFERENCE FOR INPUT BUFFER

(71) Applicant: Freescale Semiconductor, Inc., Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/906,113

(22) Filed: May 30, 2013

(51) Int. Cl.
*G11C 5/14* (2006.01)
*H03K 3/01* (2006.01)

(52) U.S. Cl.
CPC .......................................... *H03K 3/01* (2013.01)
USPC ............................ 327/530; 327/108; 327/538

(58) Field of Classification Search
USPC .................................... 327/108, 333, 538, 540
See application file for complete search history.

(56) References Cited

U.S. PATENT DOCUMENTS

| 5,179,297 A | * | 1/1993 | Hsueh et al. .................. 327/530 |
| 5,287,063 A | | 2/1994 | Izawa |
| 2006/0220704 A1 | | 10/2006 | Butler |

OTHER PUBLICATIONS

"Voltage Measurement Accuracy, Self-Calibration, and Ratiometric Measurements" White Paper Code: 3. Campbell Scientific, Inc. 815 W. 1800 N, Logan, Utah, 84321-1784, 2001. pp. 1-6.

* cited by examiner

*Primary Examiner* — Long Nguyen
(74) *Attorney, Agent, or Firm* — Gary Stanford

(57) ABSTRACT

A self adjusting reference for an input buffer including an adjustable voltage shifter, a comparator, and a comparator and adjust circuit. The voltage shifter provides adjustable reference voltages based on a primary reference voltage, including upper, midway, and lower reference voltages. The comparator compares the midway reference voltage with the input voltage to provide an input sense signal indicative of a voltage state of the input voltage. The comparator and adjust circuit increases voltage levels of the reference voltages when the input voltage is in a low voltage state and has a voltage level that is greater than the lower reference voltage, and decreases the voltage levels of the reference voltages when the input voltage is in a high voltage state and has a voltage level that is less than the upper reference voltage.

20 Claims, 7 Drawing Sheets

600

US 8,872,578 B1

SELF ADJUSTING REFERENCE FOR INPUT BUFFER

BACKGROUND OF THE INVENTION

1. Field of the Invention

This disclosure relates generally to input buffers, and more specifically, to a self adjusting reference for an input buffer.

2. Description of the Related Art

As signal data rates become faster and signal swings become smaller, the tolerance between an input reference voltage and an input signal becomes more difficult to maintain. As the relative noise level increases, the signal-to-noise ratio (SNR) decreases which increases the potential for latching erroneous information. In addition, the input signal may tend to drift up or down relative to the reference voltage further increasing the potential for latching erroneous information.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present inventor has recognized that the tolerances between reference voltages and corresponding input signals should be maintained to ensure data capture integrity as signal data rates increase and signal swings decrease. He has therefore developed a self adjusting reference for an input buffer with a self-supplied calibrating input reference. The reference voltage is continually adjusted or otherwise periodically calibrated relative to the incoming signal to maintain the desired tolerance level.

Figure 1:
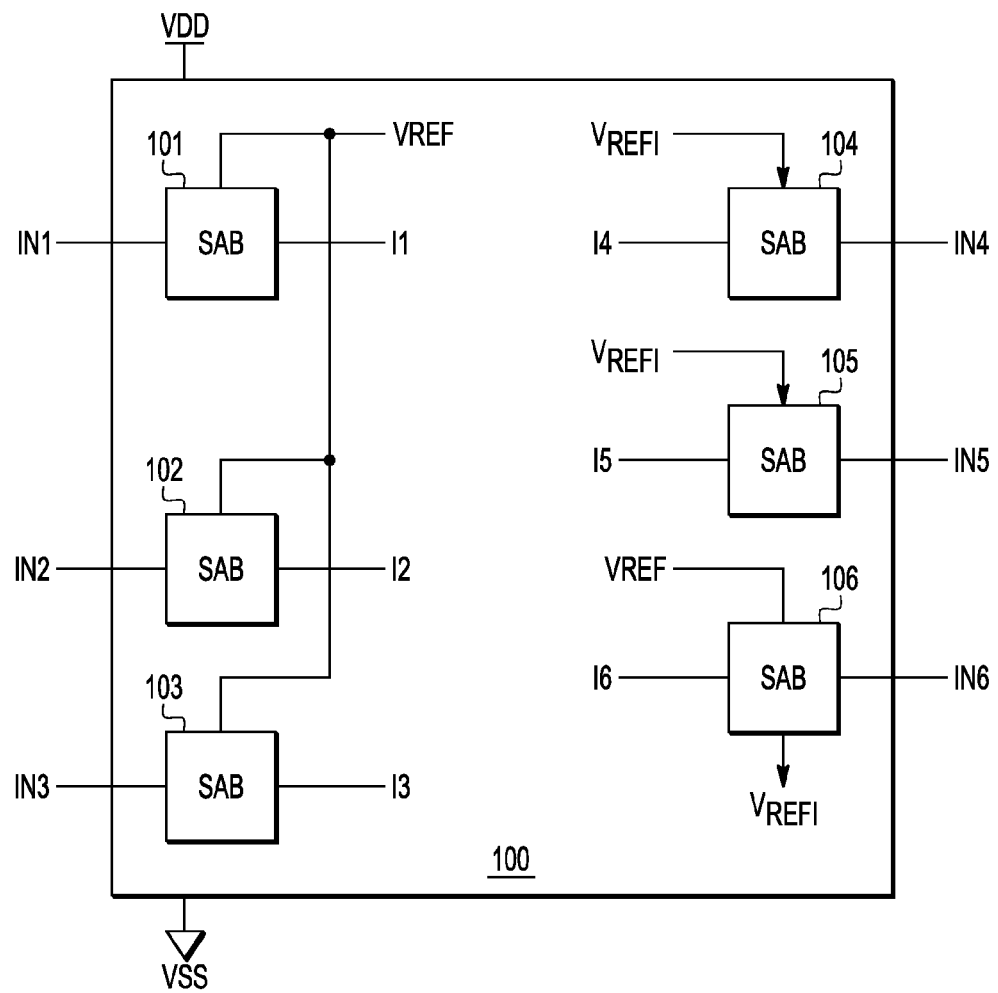
FIG. 1 is a simplified block diagram of an integrated circuit (IC) or semiconductor chip incorporating self adjusting buffers (SABs) which reliably latch input signals IN1, IN2 and IN3 as latched signals I1, I2 and I3, respectively.

FIG. 1 is a simplified block diagram of an integrated circuit (IC) 100 or semiconductor chip incorporating self adjusting buffers (SABs) 101, 102 and 103 which reliably latch input signals IN1, IN2 and IN3 as latched signals I1, I2 and I3, respectively. The IC 100 is coupled to supply voltage nodes for receiving supply voltages VDD and VSS. For the input signals IN1-IN3, a separate SAB is provided for each input signal. Each SAB 101-103 receives a primary reference voltage VREF, which is generated on chip or received or otherwise derived from a reference signal provided off-chip. As described further herein, each SAB 101-103 develops an internal reference voltage having a voltage level which is adjusted to track or follow its corresponding input signal.

In an alternative embodiment, standard or conventional buffers (B) may be used to latch input signal using a self-adjusted reference voltage from a SAB. As shown, for example, input signals IN4 and IN5 are latched to internal signals I4 and I5 using conventional buffers 104 and 105, respectively. Although the buffers 104 and 105 are not SABs, they receive and use a reference signal $V_{REFI}$ developed and provided from another SAB 106. SAB 106 receives VREF and latches input signal IN6 to internal signal I6. SAB 106 develops a self adjusting the reference signal $V_{REFI}$ to track IN6. In this case it is presumed that similar noise sources modify IN4-IN6 so that $V_{REFI}$ is suitable to track input signals IN4 and IN5. If this is not the case, then separate SABs may be provided for each input signal. In this manner, for different configurations or embodiments, any number of input signals may be buffered with separate SABs and/or any number of the input signals may be buffered with conventional buffers using reference signals from one or more SABs.

Figure 2:
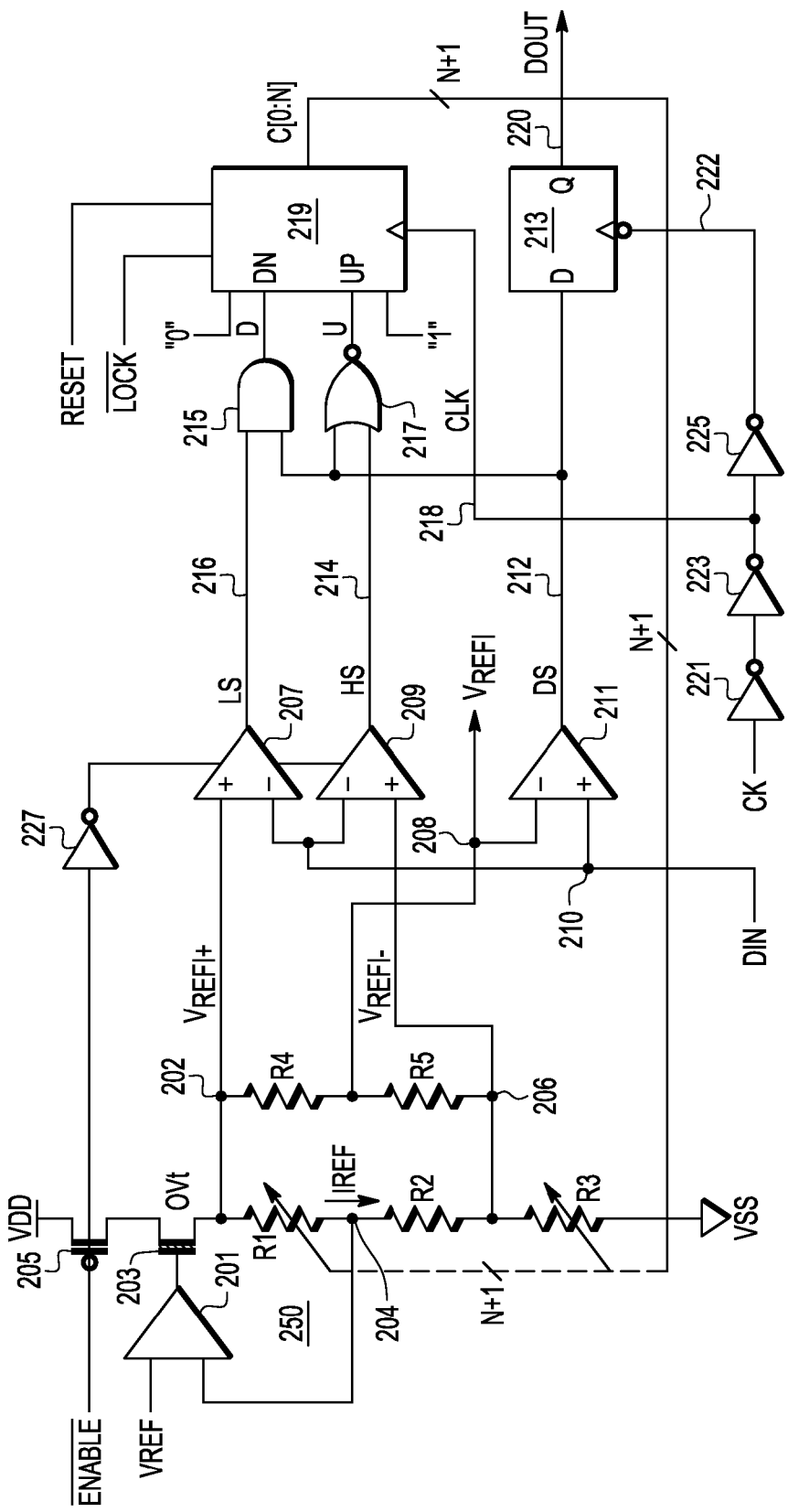
FIG. 2 is a schematic diagram of an SAB implemented according to one embodiment, which may be used as any one or more of the SABs of FIG. 1.

FIG. 2 is a schematic diagram of an SAB 200 implemented according to one embodiment, which may be used as any one or more of the SABs 101-103, 106 of FIG. 1. VREF is provided to one input of an amplifier 201, having its output coupled to the gate of an N-type MOS (NMOS) transistor 203, having its drain coupled to the drain of a P-type MOS (PMOS) transistor 205 and its source coupled to a node 202 developing an upper reference voltage $V_{REFI+}$. The NMOS transistor 203 is a device with a threshold voltage (Vt) targeted at 0 Volts (V), shown as 0Vt, which may be achieved by adjusting the channel doping. In one embodiment, the NMOS transistor 203 has a different configuration from a nominal device on the IC 100. It is noted that heavily scaled semiconductor processes often have two or more threshold voltages available for NMOS devices to be selectively used for noise management, leakage control, and other low voltage functionality. If a 0Vt device is not available, then an NMOS transistor with the lowest threshold voltage may be selected. The transistors illustrated herein are MOS devices although alternative transistor types may be used. In general, each transistor has current terminals (e.g., drain, source, emitter, collector, etc.) and a control terminal (e.g., gate, base, etc.).

Node 202, which develops the upper reference voltage $V_{REFI+}$, is further coupled to one end of an adjustable resistor R1 and another resistor R4 and to the positive (or non-inverting) input of a comparator 207. The other end of R1 is coupled to a control node 204, which is coupled to one end of a resistor R2 and to the other input of the amplifier 201. The other end of R2 is coupled to a node 206 which develops a lower voltage reference $V_{REFI-}$. Node 206 is further coupled to one end of another adjustable resistor R3, to one end of a resistor R5, and to the positive input of another comparator 209. The other end of the resistor R3 is coupled to VSS. The other ends of the resistors R4 and R5 are coupled together at a node 208 developing a middle or midway reference voltage $V_{REFI}$.

The amplifier 201, the NMOS transistor 203, and the resistors R1-R5 collectively form an adjustable voltage shifter 250 that provides the adjustable reference voltages $V_{REFI+}$, $V_{REFI}$, and $V_{REFI-}$, based on the primary reference voltage VREF. In the illustrated embodiment, the resistors R1 and R3 are adjustable responsive to an adjust value. In one embodiment, the adjust value is a digital adjust value for selecting node voltages of a resistor ladder or the like forming each adjustable resistor R1 and R3 for adjusting the reference voltages as further described herein. In one embodiment, the adjust value is a digital thermometer value.

Node 208, which develops the midway reference voltage $V_{REFI}$, is further coupled to the negative (inverting) input of another comparator 211, having its positive input coupled to a node 210 receiving an input signal DIN. DIN may represent any of the input signals IN1-IN3 or IN6 or the like. DIN is further provided to the negative inputs of the comparators 207 and 209. An inverted enable signal $\overline{ENABLE}$ is provided to the gate of the PMOS transistor 205, which has its source coupled to supply voltage VDD. The $\overline{ENABLE}$ signal is further provided to the input of an inverter 227, having its output coupled to the enable inputs of the comparators 207 and 209.

The comparator 211 has an output coupled to a node 212 which develops an input sense signal DS, which is provided to the data (D) input of a transparent latch 213, to one input of a 2-input logic AND gate 215, and to one input of a 2-input logic NOR gate 217. The comparator 209 has an output coupled to a node 214 which develops a high sense signal HS, which is provided to the other input of the NOR gate 217. The comparator 207 has an output coupled to a node 216 which develops a low sense signal LS, which is provided to the other input of the AND gate 215. The output of the AND gate 215 asserts an adjust down signal D, which is provided to the down input DN of an up/down thermometer shift register 219. The output of the NOR gate 217 asserts an adjust up signal U, which is provided to the up input UP of the up/down thermometer shift register 219. The up/down thermometer shift register 219 has an inverted lock input for receiving an inverted lock signal $\overline{LOCK}$, a reset input receiving a reset signal RESET, a clock input receiving a clock signal CLK, and an output providing a digital adjust or control value in the form of a digital thermometer value C[0:N]. The thermometer value C[0:N] includes N+1 bits which are fed back to the adjust inputs of the adjustable resistors R1 and R3.

An input clock signal CK is provided through two inverters 221 and 223 to develop the CLK signal on a node 218, which is coupled to the clock input of the up/down thermometer shift register 219. Node 218 is further coupled to the input of another inverter 225, having its output coupled to a node 222 provided to the inverted clock input of the latch 213. The Q output of the latch 213 is coupled to a node 220 developing an output signal DOUT, which may represent any of the internal latched input signals I1-I3 or I6 or the like. It is noted that series-coupled inverters and selection of intermediate nodes thereof are used herein for timing purposes, such as for developing timing delays and the like.

In operation of the SAB 200, the $\overline{ENABLE}$ signal is pulled low to turn on PMOS transistor 205 and to enable the comparators 207 and 209. When the $\overline{ENABLE}$ signal is pulled high, the SAB 200 is effectively disabled. When the $\overline{ENABLE}$ signal is negated high and the $\overline{LOCK}$ signal is asserted low, the thermometer value C[0:N] is "frozen" and thus held at its current value. When the SAB 200 is enabled, the amplifier 201 controls the NMOS transistor 203 to develop a reference current IREF through the series-coupled resistors R1-R3 to maintain the voltage level of the control node 204 at VREF. The amplifier 201 thus buffers VREF to maintain the voltage level of the control node 204 at VREF. The resistance of R2 and the voltage of VREF remain constant.

The digital thermometer value C[0:N] adjusts the resistances of R1 and R3 up or down in the same direction. The resistances of R4 and R5 are significantly greater than the resistances of R1-R3. Neglecting the small current through R4 and R5, which is small compared to IREF, the current IREF=VREF/(R1+R2). When the resistances of R1 and R3 are increased, the value IREF is decreased and the voltage $V_{REFI-}$ increases due the change in the voltage divider R1 and R2. $V_{REFI+}$=VREF+$V_{REFI}$*R3, where $V_{REFI}$ is the changed value set by VREF/(R1+R2) when R1 is increased. When the resistance of R1 is increased, the resistance of R3 is increased so that the voltage R3*IREF (where IREF is the changed value) is increased in the same amount as the voltage $V_{REFI-}$ was increased, maintaining the voltage difference between $V_{REFI-}$ and $V_{REFI+}$ constant while increasing the value of the two references by the same value.

In one embodiment, the resistors R4 and R5 have substantially equal resistances, so that $V_{REFI}$ remains half-way between $V_{REFI+}$ and $V_{REFI-}$ with a substantially equal tolerance voltage $V_{TOL}$ between $V_{REFI+}$ and $V_{REFI}$ and between $V_{REFI}$ and $V_{REFI-}$. It is noted that the voltage tolerances between the upper and lower reference voltages may be different in alternative configurations. When C[0:N] is adjusted to increase R1 and R3, the voltages of $V_{REFI+}$, $V_{REFI}$ and $V_{REFI-}$ increase by the same amount, and when C[0:N] is adjusted to decrease R1 and R3, the voltages of $V_{REFI+}$, $V_{REFI}$ and $V_{REFI-}$ decrease by the same amount. The difference between the upper and lower reference voltages, or $V_{REFI+}$-$V_{REFI-}$, remains constant and the voltage of $V_{REFI}$ remains mid-way between. The voltage difference of $V_{REFI+}$-$V_{REFI-}$ is held at a constant that is selected so that the difference $V_{REFI+}$-$V_{REFI-}$ is less than the expected peak-to-peak voltage of DIN. Furthermore the difference $V_{REFI+}$-$V_{REFI-}$ is sufficiently small to ensure the DIN crosses $V_{REFI}$ to ensure that comparator 211 outputs the signal DS to reflect the correct value of the logic state of DIN on node 212. In this manner, $V_{REFI+}$, $V_{REFI}$ and $V_{REFI-}$ have adjustable reference voltage levels to track DIN to ensure data integrity.

When the resistances of R1 and R3 may be adjusted by the thermometer value C[0:N], the resistance values may further be modified by a small amount to compensate for the small current through R4 and R5.

In this manner, the reference voltages are considered balanced when $V_{REFI+}$ is less than the upper voltage level of DIN and $V_{REFI-}$ is greater than the lower voltage level of DIN, so that the midway reference voltage $V_{REFI}$ is centered at the average level of DIN. As described further herein, $V_{REFI+}$ is compared with the upper voltage level of DIN and $V_{REFI-}$ is compared with the lower level of DIN to determine whether the reference voltages are balanced relative to DIN. If DIN has shifted up or down relative to the reference voltages, then the reference voltages are shifted up or down by an appropriate amount to return to the balanced state to keep $V_{REFI}$ centered with DIN to ensure data integrity.

The comparator 211 compares DIN with $V_{REFI}$ and asserts DS high when DIN is greater than $V_{REFI}$ at a high logic level and asserts DS low when DIN is less than $V_{REFI}$ at a low logic level. Assuming that $V_{REFI}$ is properly centered, then $V_{REFI+}$ is less than DIN when DIN is at a logic high and $V_{REFI-}$ is greater than DIN when DIN is at a logic low. If the voltage level of DIN drifts upwards such that $V_{REFI-}$ is less than DIN when DIN is at a logic low, then the NOR gate 217 asserts U high to send an up signal to the up/down thermometer shift register 219, which adjusts C[0:N] accordingly to increase R1 and R3 to increase $V_{REFI+}$, $V_{REFI}$ and $V_{REFI-}$ in response so that $V_{REFI-}$ is once again greater than DIN. Similarly, if the voltage level of DIN drifts downwards such that $V_{REFI+}$ is greater than DIN when DIN is at a logic high, then the AND gate 215 asserts D high to send a down signal to the up/down thermometer shift register 219, which adjusts C[0:N] accordingly to decrease R1 and R3 to decrease $V_{REFI+}$, $V_{REFI}$ and $V_{REFI-}$ in response so that $V_{REFI+}$ is once again less than DIN.

In this manner, as the voltage of the input signal DIN drifts upwards or downwards, the SAB 200 adjusts the reference voltages accordingly to keep $V_{REFI}$ substantially centered with DIN to improve detection and accuracy of latch operation. Furthermore, the SAB 200 is capable of detecting a smaller input signal.

Figure 3:
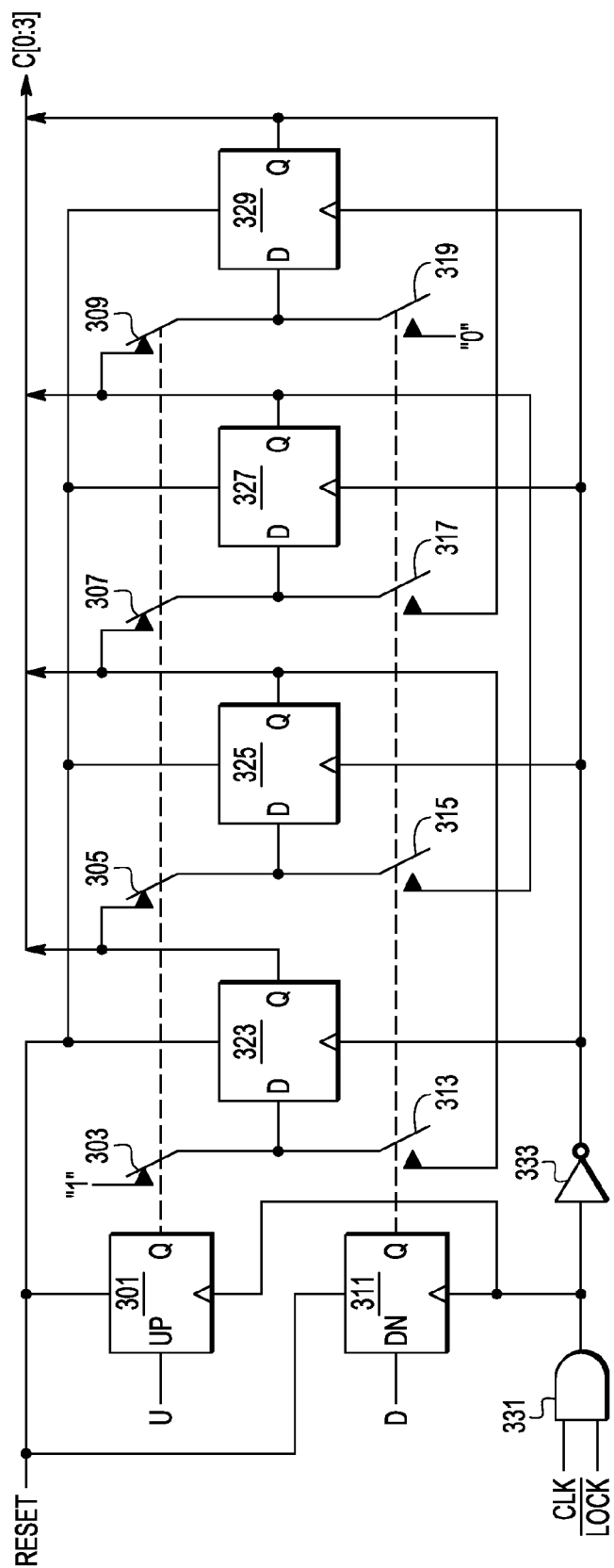
FIG. 3 is a schematic diagram of an up/down thermometer shift register which may be used as the up/down thermometer shift register of FIG. 2.

FIG. 3 is a schematic diagram of an up/down thermometer shift register 300 which may be used as the up/down thermometer shift register 219. In this case, N is 3 so that the adjust value is C[0:3] to provide a total of 5 binary thermometer values 0000, 0001, 0011, 0111 and 1111. It is appreciated that N may be any suitable value to provide any suitable number of adjust values for a given configurations. A thermometer register with N=3 has a relatively limited adjust granularity but is used for purposes of illustration.

The up signal U is provided to the "UP" input of a transparent latch 301, which has a Q output coupled to the control input of a series of single-pole, single-throw (SPST) switches 303, 305, 307 and 309. The down signal D is provided to the down input "DN" of another transparent latch 311, which has a Q output coupled to the control input of another series of SPST switches 313, 315, 317 and 319. The D input of a series of latches 323, 325, 327 and 329 is coupled to a first switched terminal of each of the switches 303, 305, 307, 309, 313, 315, 317 and 319. The other switched terminal of switch 303 receives a logic "1" value, the other switched terminal of switch 305 is bit C[0] and is coupled to the Q output of the latch 323, the other switched terminal of switch 307 is bit C[1] and is coupled to the Q output of the latch 325 and to the other switched terminal of switch 313, and the other switched terminal of switch 309 is bit C[2] and is coupled to the Q output of the latch 327 and to the other switched terminal of switch 315. The Q output of the latch 329 is bit C[3] and is coupled to the other switched terminal of switch 317. The other switched terminal of switch 319 receives a logic "0" value. The $\overline{LOCK}$ and CLK signals are provided to respective inputs of a 2-input AND gate 331, having an output coupled to the clock inputs of the latches 301 and 311 and to the input of an inverter 333. The output of the inverter 333 is provided to the clock input of each of the latches 323-329. The RESET signal is provided to reset inputs of the latches 301, 311 and 323-329.

In operation of the up/down thermometer shift register 300, the RESET input is used for resetting the circuit and the $\overline{LOCK}$ signal is for effectively freezing operation to maintain the C[0:3] value while $\overline{LOCK}$ is asserted low. Assuming RESET is low and $\overline{LOCK}$ is high, when the U signal is asserted and CLK is high, the switches 303-309 are closed, When CLK next goes low, the U signal is latched, and a logic "1" is shifted and latched into latch 323, the prior value of the latch 323 is latched into the next latch 325, the prior value of the latch 325 is latched into the next latch 327, and the prior value of the latch 327 is latched into the next latch 329. In this manner, a logic "1" is shifted in to the left and the C[0:3] value is right-shifted.

Assuming RESET is low and LOCK is high, when the D signal is asserted and CLK is high, the switches 313-319 are closed, When CLK next goes low, the D signal is latched, and a logic "0" is shifted and latched into latch 329, the prior value of the latch 329 is latched into the prior latch 327, the prior value of the latch 327 is latched into the prior latch 325, and the prior value of the latch 325 is latched into the prior latch 323. In this manner, a logic "0" is shifted in to the right and the C[0:3] value is left-shifted.

The "lowest" binary value 0000 of C[0:3] causes the lowest value for the resistors R1 and R3, which results in the lowest voltage levels for the reference voltages $V_{REFI+}$, $V_{REFI}$, and $V_{REFI-}$. Similarly, the "highest" binary value 1111 causes the highest value for the resistors R1 and R3, which results in the highest voltage levels for the reference voltages $V_{REFI+}$, $V_{REFI}$, and $V_{REFI-}$. In response to the U signal, a logic "1" is shifted into the left and the C[0:3] value is right-shifted to increase the reference voltages. For example, if the C[0:3] value is 1100 and the U signal is asserted high, then the next value of C[0:3] value is 1110 thereby increasing the reference voltages $V_{REFI+}$, $V_{REFI}$, and $V_{REFI-}$. On the other hand, if the C[0:3] value is 1100 and the D signal is asserted high, then the next value of C[0:3] value is 1000 thereby decreasing the reference voltages $V_{REFI+}$, $V_{REFI}$, and $V_{REFI-}$.

It is appreciated that a 4-bit thermometer value for C[0:3] (N=3) may only allow for relatively limited adjustment of the reference voltages. Nonetheless, for certain configurations a relatively limited level of adjustment may be suitable for the expected input signal voltage range. In alternative embodiments, N may be changed (increased or decreased) to any suitable number to allow for greater adjustment granularity. The adjustable resistors R1 and R3 are configured accordingly.

Figure 4:
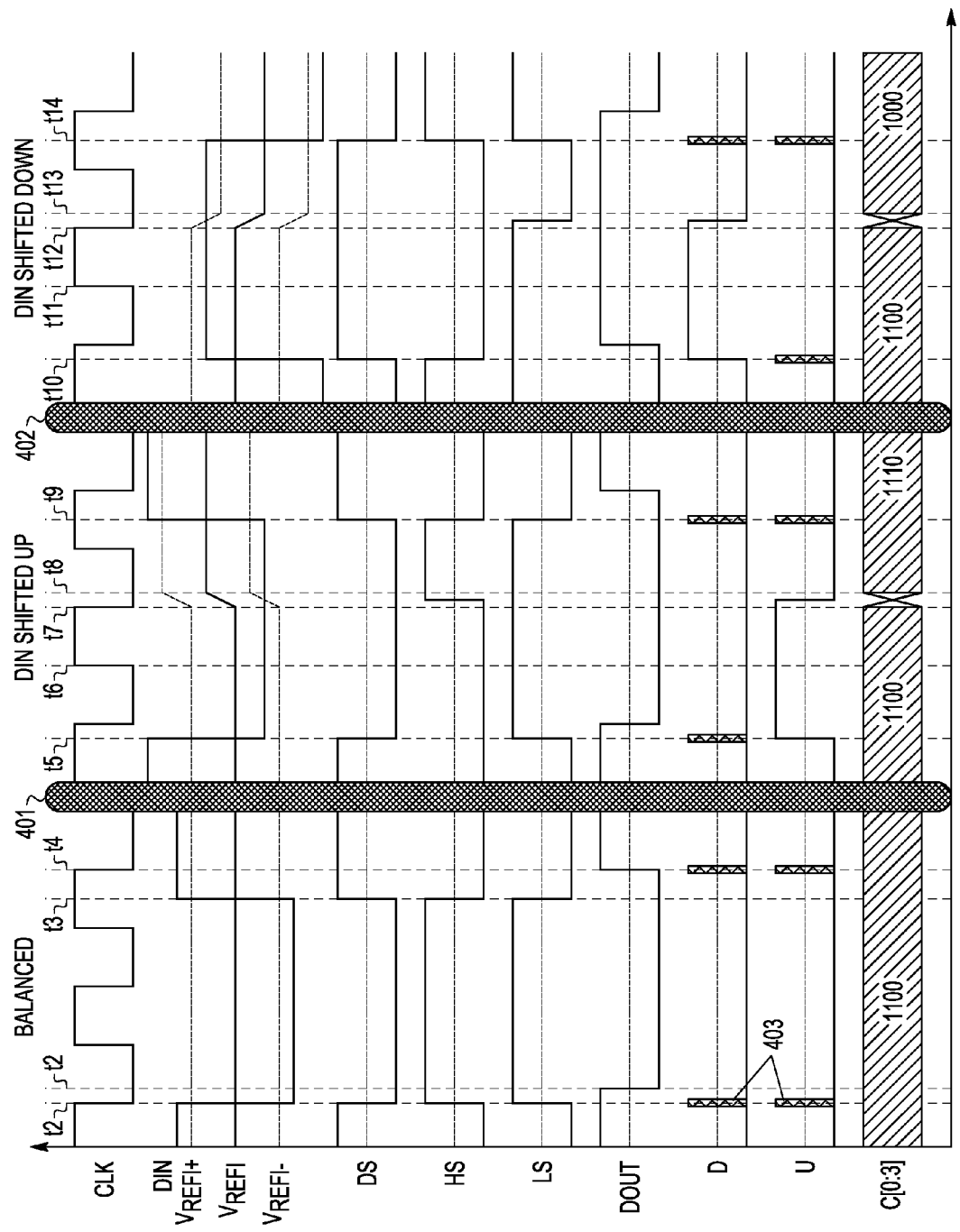
FIG. 4 is a timing diagram illustrating operation of the SAB of FIG. 2 in which the up/down thermometer shift register is configured the same or similar to the up/down thermometer shift register of FIG. 3 with N=4.

FIG. 4 is a timing diagram illustrating operation of the SAB 200 in which the up/down thermometer shift register 219 is configured the same or similar to the up/down thermometer shift register 300 with N=3. The signals CK, DIN, $V_{REFI+}$, $V_{REFI}$, $V_{REFI-}$, DS, HS, LS, DOUT, D, and U and the value C[3:0] are plotted verses time in which DIN is enlarged and superimposed with the reference signals $V_{REFI+}$, $V_{REFI}$, and $V_{REFI-}$. Three different time periods are illustrated including a balanced time period, a second time period in which DIN has shifted up relative to the reference voltages, and a third time period in which DIN has shifted down relative to the reference voltages. Each time period is shown for a duration of three full cycles of the main clock signal CK and in which the time periods are separated by undetermined time periods shown at 401 and 402. The signals are shown without delays and in simplified square-wave form to more clearly illustrate functional operation of the SAB 200. Actual signals may have rounded transitions and may have inconsequential delays. Operation of the SAB 200 is substantially the same with actual waveforms.

During the first balanced time period, DIN is initially high (or has a high voltage state) and goes low (to a low voltage state) at a time t1 during the first cycle of CK, and then goes back high at a time t3 during the third cycle of CK. During the balanced state, DIN is balanced with respect to the reference voltage such that when DIN is high, it is greater than $V_{REFI+}$, and when DIN is low it is less than $V_{REFI-}$. DS, HS and LS each transition in response to DIN in which DS generally transitions to maintain the same logic state as DIN, while HS and LS transition to opposite logic states as DIN in the balanced configuration. DOUT follows the state of DIN when the latch 213 is transparent, which occurs while CK is low. DOUT is held at its current value while CK is high. Thus, DOUT goes low when CK goes low at a time t2, and goes high when CK goes low at time t4. Thus, DOUT follows DIN except synchronized with CK.

Since DS and LS toggle to opposite states in the balanced state, D generally remains asserted low. Also, since DS and HS toggle to opposite states, U generally remains asserted low. It is noted that D and U may transition with the DS, HS and LS signals during "glitch" periods illustrated at 403, but such indeterminate states are inconsequential since the signals stabilize at the rising edges of CK when the latches are clocked. The initial value of C[0:3] is shown as binary 1100. Since the D and U signals remain negated low, the value of C[0:3] remains unchanged. Operation continues in this manner as long as DIN is balanced with respect to the reference signals.

During the second period, DIN is logically shifted in the same manner as the first period in which it starts high, goes low at a time t5 during the first cycle of CK, and then goes back high at a time t9 during the third cycle of CK. DIN, however, has shifted up relative to the reference signals. Although DIN has shifted up, it has not shifted past the midway reference voltage $V_{REFI}$ so that signal DS follows DIN in the same manner and DOUT remains valid. Also, DIN toggles relative to $V_{REFI+}$ in the same manner so that signal LS, and thus D, remain the same as that shown in the balanced state.

When DIN goes low at time t5, however, it remains higher than $V_{REFI-}$. HS thus remains low, and since DS and HS are both low, the U signal goes high and stays high at the next rising edge of CK at a time t6. At this time, the U value is latched into the up/down thermometer shift register 219. The C[0:3] remains unchanged, however, until the subsequent falling edge of CK at time t7. Beginning at about time t7 until a short time later at a time t8, the C[0:3] transitions from binary 1100 to 1110 causing a corresponding increase of each of the reference signals $V_{REFI+}$, $V_{REFI}$ and $V_{REFI-}$ back to a balanced relationship with DIN. During this transition, $V_{REFI-}$ rises above DIN, so that HS goes back high and U goes back low. After time t8, operation essentially returns to a balanced state in which DIN rises above $V_{REFI+}$ when high as shown at time t9, and falls below $V_{REFI-}$ when low.

It is appreciated that although DIN has shifted up, it remained in a proper relationship with the midway reference voltage $V_{REFI}$ so that DS remained accurate and thus DOUT is latched to the correct logic state. Noise and/or additional upward drift of DIN, however, could jeopardize the relationship between DIN and the midway reference voltage $V_{REFI}$ which may ultimately result in an incorrect latched value. The SAB 200 self-calibrates and adjusts back to a balanced configuration to compensate for the upward shift of DIN and to allow further adjustments of the reference voltage to continuously track the voltage level of DIN.

During the third period, DIN is logically shifted in an opposite manner as the first and second periods in which it starts low, goes high at a time t10 during the first cycle of CK, and then goes back low at a time t14 during the third cycle of CK. In this case, however, DIN has shifted down relative to the reference signals. The states of DIN are opposite that of the first two periods to more clearly illustrate a down shift of the reference voltages. Although DIN has shifted down, it has not shifted past the midway reference voltage $V_{REFI}$ so that signal DS follows DIN in the same manner and DOUT remains valid. Also, DIN toggles relative to $V_{REFI-}$ in the same manner so that signals HS, and thus U, remain valid.

When DIN goes high at time 10, however, it remains lower than $V_{REFI+}$. LS thus remains high, and since DS and LS are both high, the D signal goes high and stays high at the next rising edge of CK at a time t11. At this time, the D signal is latched into the up/down thermometer shift register 219. The C[0:3] remains unchanged, however, until the subsequent falling edge of CK at time t12. Beginning at about time t12 until a short time later at a time t13, the C[0:3] transitions from binary 1100 to 1000 causing a corresponding decrease of each of the reference signals $V_{REFI+}$, $V_{REFI}$ and $V_{REFI-}$ back to a balanced relationship with DIN. During this transition, $V_{REFI+}$ falls below DIN, so that LS and D both go back low. After time t13, operation essentially returns to a balanced state in which DIN rises above $V_{REFI+}$ when high and falls below $V_{REFI-}$ when low as shown at time t14.

In a similar manner as described for the case when DIN shifted up, it is appreciated that although DIN has shifted down, it remained in a proper relationship with the midway reference voltage $V_{REFI}$ so that DS remained accurate and thus DOUT is latched to the correct logic state. Noise and/or additional downward drift of DIN, however, could jeopardize the relationship between DIN and the midway reference voltage $V_{REFI}$ which may ultimately result in an incorrect latched value. The SAB 200 self-calibrates and adjusts back to a balanced configuration to compensate for the downward shift of DIN and to allow further adjustments of the reference voltage to continuously track the voltage level of DIN.

Figure 5:
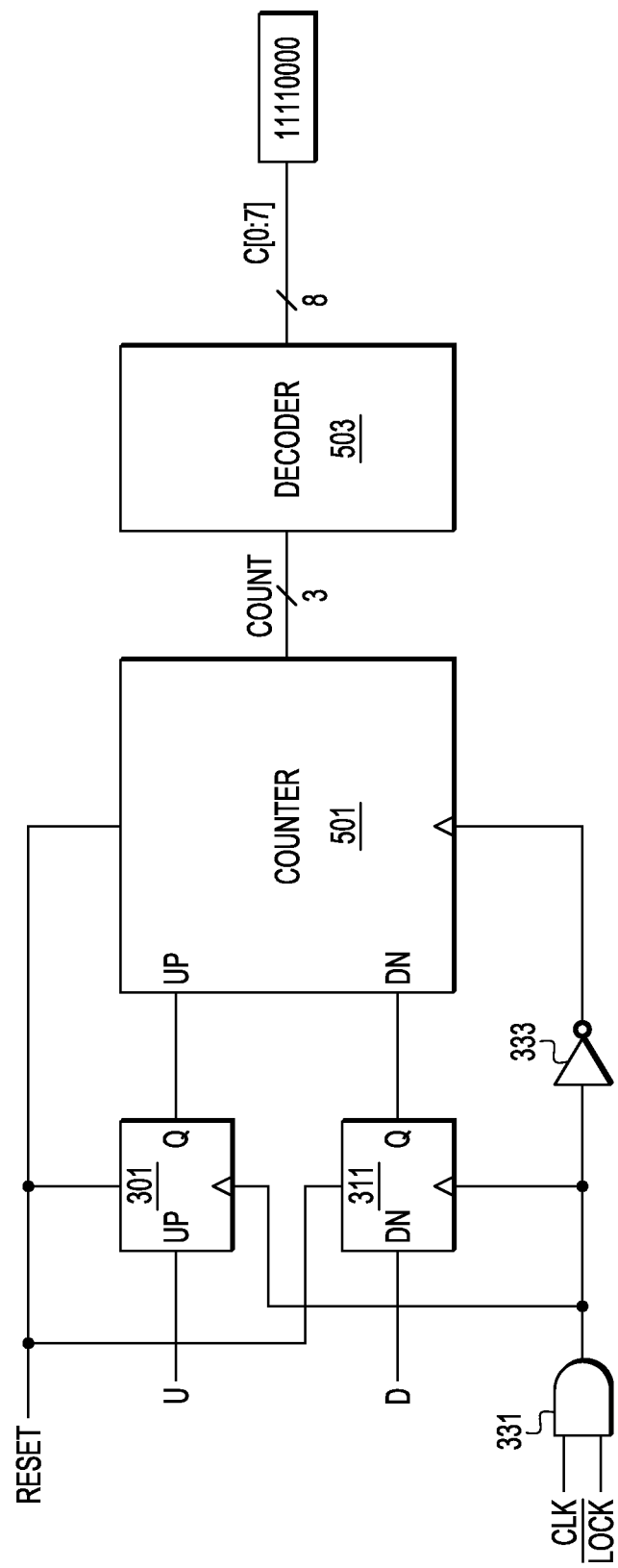
FIG. 5 is a simplified block diagram of an adjust circuit providing a digital thermometer value using a counter and decoder according to another embodiment which may be used in the place of the up/down thermometer shift register of FIG. 2.

FIG. 5 is a simplified block diagram of an adjust circuit 500 providing a digital thermometer value C[0:7] using a counter 501 and decoder 503 which may be used as the up/down thermometer shift register 219 in an alternative embodiment. The transparent latches 301 and 311, the AND gate 331, and the inverter 333 are provided and coupled to operate in similar manner. As shown, the up signal U is provided to the "UP" input of latch 301 and the down signal D is provided to the inverted down "DN" input of the latch 311. CLK and LOCK are provided to the inputs of the AND gate 331, having its output coupled to the clock inputs of the latches 301 and 311 and the inverter 333. The Q output of the latch 301 is provided to an up input UP of a counter 501 and the Q output of the latch 311 is provided to a down input DN of the counter 501. The output of the inverter 333 is provided to the clock input of the counter 501. RESET is provided to the reset inputs of the latches 301 and 311 and the counter 501. The counter 501 is a 3-bit counter which outputs a 3-bit binary value COUNT to the inputs of a decoder 503. The decoder 503 decodes COUNT into an 8-bit thermometer value C[0:7] in which N=7.

Operation of the adjust circuit 500 is similar to that described for the up/down thermometer shift 300, except that the counter 501 and decoder 503 allow for a larger adjust value C[0:7]. Assuming $\overline{LOCK}$ is high and RESET is low, upon each rising edge of CLK, if U is high then an UP input is provided to increment COUNT, and if D is high then a DN input is provided to decrement COUNT. The value COUNT has binary values 000, 001, 010, 011 . . . 111. The decoder 503 converts the binary value COUNT to the thermometer value C[0:7] with 9 different binary values 00000000, 00000001, 00000011, 00000111, . . . , 11111111 in a similar manner previously described. The number of bits in counter 501 and decoder 503 may be selected either higher or lower to adjust the desired granularity of the resistance adjustments of R1 and R3.

Figure 6:
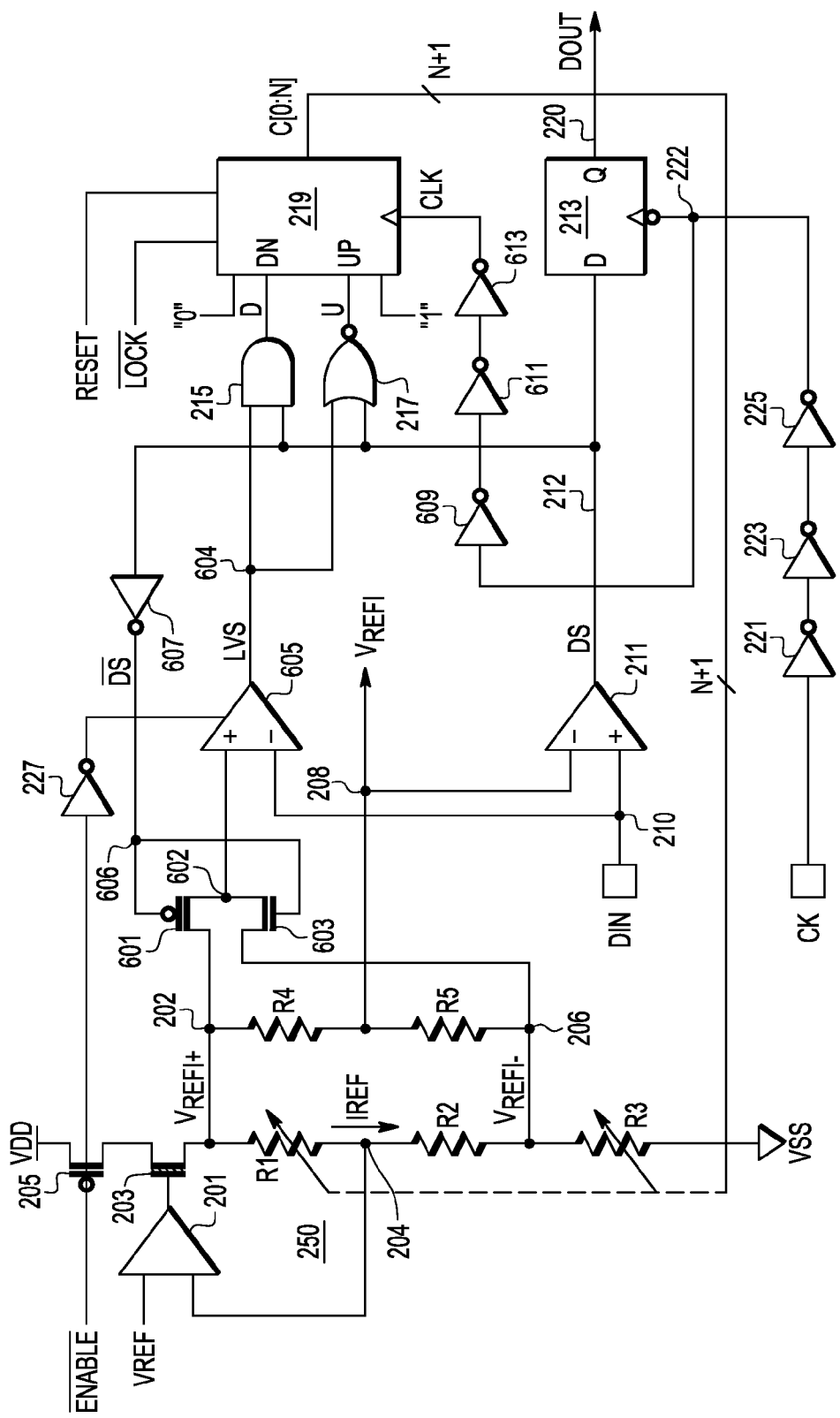
FIG. 6 is a schematic diagram of an SAB implemented according to another continuous sample embodiment, which may be used as any one or more of the SABs of FIG. 1.

FIG. 6 is a schematic diagram of an SAB 600 implemented according to another continuous sample embodiment, which may be used as any one or more of the SABs 101-103, 106 of FIG. 1. Similar components as those of the SAB 200 assume identical reference numbers. In this case, the amplifier 201, the NMOS transistor 203, the PMOS transistor 205, the resistors R1-R5, the comparator 211, the latch 213, the AND gate 215, the NOR gate 217, the up/down thermometer shift register 219, and the inverters 221, 223, 225 and 227 are provided and coupled in similar manner.

In this embodiment, the adjustable voltage shifter 250 operates in substantially the same manner for developing and adjusting the reference voltages based on an adjust value. The node 202 developing the reference voltage $V_{REFI+}$ is provided to a current terminal (e.g., source or drain terminal) of a PMOS transistor 601 and node 206 developing the reference voltage $V_{REFI-}$ is provided to a current terminal of an NMOS transistor 603. The other current terminals of the PMOS and NMOS transistors 601 and 603 are coupled together at a node 602, which is provided to the positive input of a comparator 605. The PMOS and NMOS transistors 601 and 603 and the comparator 605 effectively replace the pair of comparators 207 and 209. The output of the inverter 227 is provided to the enable input of the comparator 605, and the output of the comparator 605 develops a level sense signal LVS which is provided to one input each of the AND gate 215 and the NOR gate 217.

Node 212 developing the DS signal is provided to the other inputs of the AND gate 215 and NOR gate 217 and to the D input of latch 213, having its output coupled to node 220 developing DOUT as before. In this case, node 212 is further coupled to the input of an inverter 607, having its output coupled to a node 606 developing an inverter version of the DS signal, shown as a signal $\overline{DS}$, which is provided to the gates of the PMOS transistor 601 and the NMOS transistor 603. Node 222 developing an inverted version of CK is provided to the input of an inverter 609, having its output provided through additional series-coupled inverters 611 and 613 for developing CLK provided to the clock input of the up/down thermometer shift register 219. Again, series-coupled inverters may be used for adjusting timing. The up/down thermometer shift register 219 receives CLK, D, U, RESET and $\overline{LOCK}$ and provides the adjust value C[0:N] to the adjustable resistors R1 and R3 in similar manner as previously described.

Operation of the SAB 600 is similar to the SAB 200 in which both provide continuous sampling and adjustment of the reference voltages. In this case, rather than two separate comparators, the DS signal (via $\overline{DS}$) controls the transistors 601 and 603 to select one of the signals $V_{REFI+}$ or $V_{REFI-}$ for comparison with DIN by the comparator 605 to provide the LVS signal. In this manner, one less comparator is used. By using fewer comparators, less power is consumed and less die area is used. The comparator 605 should be implemented as a relatively fast comparator and detection may be somewhat slower as compared to the SAB 200. Logical operation is similar to that shown in FIG. 4 in which the voltage of the reference signals are shifted up or down in response to voltage shifts of the DIN signal.

Figure 7:
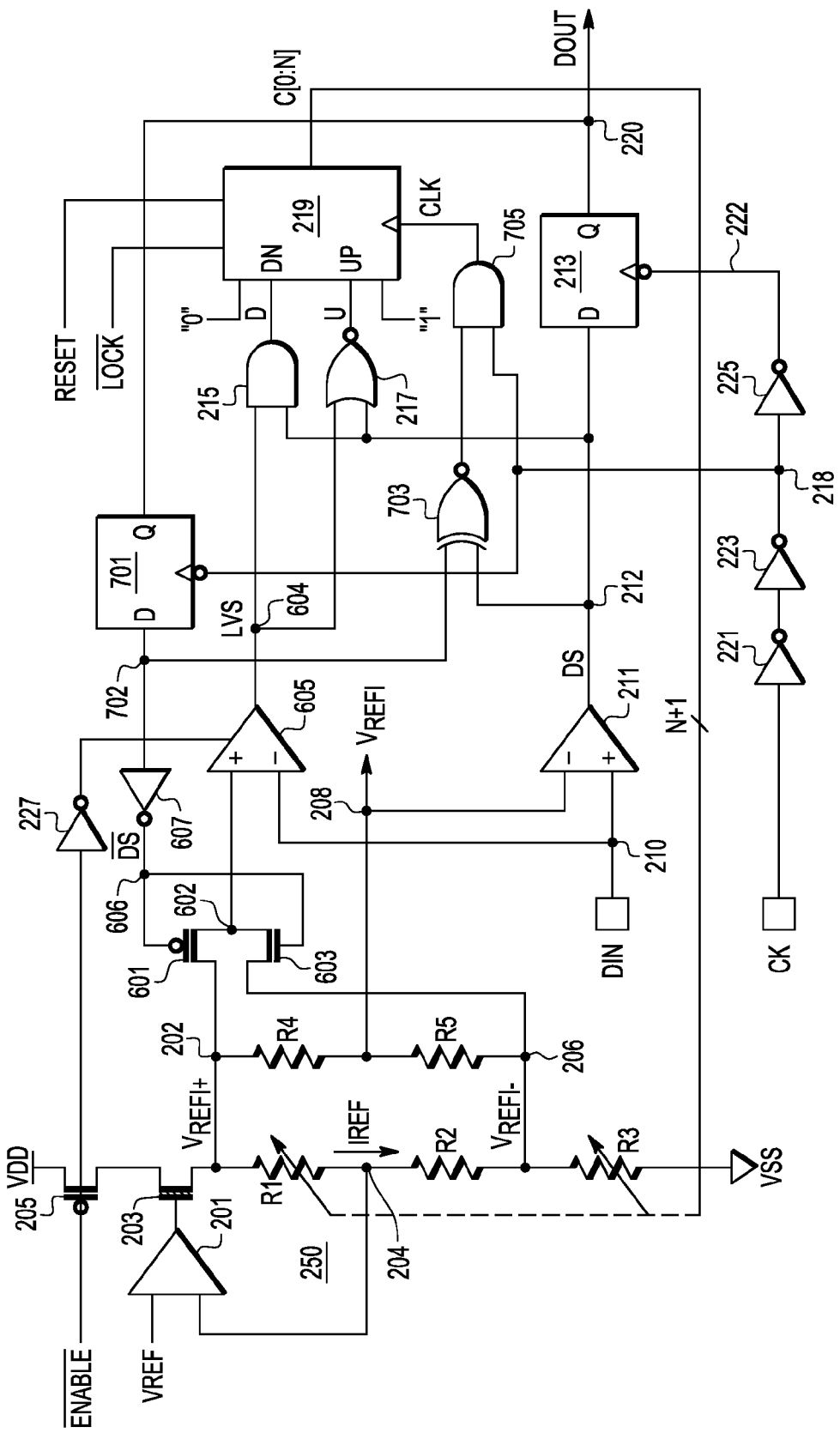
FIG. 7 is a schematic diagram of an SAB implemented according to a periodic sample embodiment, which may be used as any one or more of the SABs of FIG. 1

FIG. 7 is a schematic diagram of an SAB 700 implemented according to a periodic sample embodiment, which may be used as any one or more of the SABs 101-103, 106 of FIG. 1. Similar components as those of the SAB 200 and 600 assume identical reference numbers. In this embodiment, the amplifier 201, the NMOS transistors 203 and 603, the PMOS transistors 205 and 601, the resistors R1-R5, the comparators 211 and 605, the latch 213, the AND gate 215, the NOR gate 217, the up/down thermometer shift register 219, and the inverters 221, 223, 225, 227, and 607 are provided and coupled in similar manner. $V_{REFI}$ and DIN are provided to inputs of the comparator 211 for developing the DS signal in similar manner, where DS is provided to the D input of the latch 213 for developing DOUT in similar manner.

In this embodiment, the adjustable voltage shifter 250 operates in substantially the same manner for developing and adjusting the reference voltages based on an adjust value. The node 220 developing the DOUT signal is coupled to the D input of another transparent latch 701, having its Q output coupled to a node 702. Node 702 is coupled to the input of the inverter 607 and to one input of a 2-input XNOR gate 703. The node 212 developing the DS signal is provided to the other input of the XNOR gate 703, which has its output coupled to one input of a 2-input AND gate 705. Node 218 at the output of the inverter 223 is provided to the inverted clock input of the latch 701 and to the other input of the AND gate 705. The output of the AND gate 705 provides CLK provided to the clock input of the up/down thermometer shift register 219.

In this case the latches 213 and 701 collectively operate as a master-slave flip-flop such that when the last value of DOUT provided at node 702 is different from the next value of DOUT at node 212 when CK goes high, then the up/down thermometer shift register 219 is clocked to perform an adjust of the reference voltages. The SAB 700 anticipates a change of the logic value of DIN between successive cycles resulting in a corresponding change in DS. If no change in DS occurs in successive cycles, then the XNOR 703 inputs are the same logic value (i.e., the inputs are both a logic "1" or a logic "0") so that it outputs a logic "0" inhibits the CLK at NAND gate 705. When the logic value of DS on successive cycle are different, then the XNOR gate 703 outputs a logic "1" enabling NAND gate 705 to provide the CLK signal to shift register 219, which then responds to the signals U and D in a similar manner previously described to adjust the reference voltages. Adjustment of shift register 219 does not occur when DS does not change on successive cycles. By anticipating the value of DIN to be different between successive cycles, the output of the latch 701 is detected by the inverter 607 to enable the selection of either MOS device 601 or 603 prior to the arrival of DIN of a given cycle, thereby achieving lower power without the extra delay of the SAB 600. Thus, adjustment is made to the reference voltages, but on a periodic basis.

The SAB 700 allows for a periodic calibration cycle in which $\overline{ENABLE}$ is asserted low and a calibration pattern is injected as DIN to calibrate the reference voltages. $\overline{ENABLE}$ is then asserted high and $\overline{LOCK}$ is asserted low, freezing the output of the register 219 and operation continues with normal data until the next calibration cycle.

A self adjusting reference for an input buffer as described herein includes an adjustable voltage shifter, a comparator, and a comparator and adjust circuit. The voltage shifter provides adjustable reference voltages based on a primary reference voltage, including upper, midway, and lower reference voltages. The comparator compares the midway reference voltage with the input voltage to provide an input sense signal indicative of a voltage state of the input voltage. The comparator and adjust circuit increases voltage levels of the reference voltages when the input voltage is in a low voltage state and has a voltage level that is greater than the lower reference voltage, and decreases the voltage levels of the reference voltages when the input voltage is in a high voltage state and has a voltage level that is less than the upper reference voltage.

A method of adjusting a voltage reference for an input buffer as described herein includes receiving a primary reference voltage and an input voltage, providing upper, lower and midway reference voltages based on the primary reference voltage, comparing the midway reference voltage with the input voltage to provide an input sense signal indicative of a voltage state of the input voltage, increasing voltage levels of the reference voltages when the input voltage is in a low voltage state and has a voltage level that is greater than the lower reference voltage, and decreasing the voltage levels of the reference voltages when the input voltage is in a high voltage state and has a voltage level that less than the upper reference voltage.

A system and method as described herein maintains the appropriate tolerances between reference voltages and corresponding input signals to ensure data capture integrity. Data integrity is maintain even as signal data rates increase and/or signal swings decrease. The reference voltage is continually adjusted or otherwise periodically calibrated relative to the incoming signal to maintain the desired tolerance levels.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic or NMOS and PMOS may be used in various embodiments in which the present invention is not limited to specific logic polarities, device types or voltage levels or the like.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A self adjusting reference for an input buffer, comprising:
   an input node that receives an input voltage;
   an adjustable voltage shifter that provides a plurality of adjustable reference voltages based on a primary reference voltage, wherein said plurality of adjustable reference voltages includes a midway reference voltage, an upper reference voltage which is greater than said midway reference voltage, and a lower reference voltage which is less than said midway reference voltage;
   a comparator that compares said midway reference voltage with said input voltage to provide an input sense signal indicative of a voltage state of said input voltage; and
   a comparator and adjust circuit that increases said voltage levels of said plurality of adjustable reference voltages when said input voltage is in a low voltage state and has a voltage level that is greater than said lower reference voltage, and that decreases said voltage levels of said plurality of adjustable reference voltages when said input voltage is in a high voltage state and has a voltage level that is less than said upper reference voltage.

2. The self adjusting reference of claim 1, wherein:
   said adjustable voltage shifter maintains said upper reference voltage above said midway reference voltage by a first tolerance voltage, wherein said adjustable voltage shifter maintains said lower reference voltage below said midway reference voltage by a second tolerance voltage, and wherein a difference between said upper and lower reference voltages is less than a voltage range of said input voltage; and
   wherein said adjustable voltage shifter adjusts voltage levels of said adjustable reference voltages relative to said primary reference voltage.

3. The self adjusting reference of claim 1, wherein said adjustable voltage shifter comprises:
   a transistor having a first current terminal coupled to a first supply voltage, having a second terminal coupled to an upper node developing said upper reference voltage, and having a control terminal;
   a first resistor coupled between said upper node and a control node, a second resistor coupled between said control node and a lower node developing said lower reference voltage, and a third resistor coupled between said lower node and a second supply voltage;
   wherein said first and third resistors are adjustable resistors;
   fourth and fifth resistors coupled in series between said upper and lower nodes having a middle node developing said midway reference voltage; and
   an amplifier having a first input receiving said primary reference voltage, having a second input coupled to said control node, and having an output coupled to said control terminal of said transistor.

4. The self adjusting reference of claim 3, wherein:
   said comparator and adjust circuit provides an adjust value to adjust said plurality of adjustable reference voltages; and
   wherein said first and third resistors are responsive to said adjust value.

5. The self adjusting reference of claim 1, wherein said comparator and adjust circuit comprises:
   a first comparator having a first input coupled to said upper node, having a second input coupled to said input node, and having an output providing a low sense signal;
   a second comparator having a first input coupled to said lower node, having a second input coupled to said input node, and having an output providing a high sense signal;
   a logic circuit that develops a first adjust signal based on said input sense signal and said low sense signal and which develops a second adjust signal based on said input sense signal and said high sense signal; and
   an adjust circuit that provides an adjust value to adjust said plurality of adjustable reference voltages based on said first and second adjust signals.

6. The self adjusting reference of claim 1, wherein said comparator and adjust circuit comprises:
   a select circuit responsive to said input sense signal that selects one of said upper reference voltage and said lower reference voltage and provides a selected reference voltage;
   a second comparator having a first input coupled to said input node, a second input receiving said selected reference voltage, and an output providing a level sense signal;
   a logic circuit that develops first and second adjust signals based on said input sense signal and said level sense signal; and
   an adjust circuit that provides an adjust value to adjust said plurality of adjustable reference voltages based on said first and second adjust signals.

7. The self adjusting reference of claim 1, wherein said comparator and adjust circuit comprises:
   a latch circuit having an input receiving said input sense signal and having an output providing a delayed input signal;
   a select circuit responsive to said delayed input signal that selects one of said upper reference voltage and said lower reference voltage and provides a selected reference voltage;
   a comparator having a first input coupled to said input node, a second input receiving said selected reference voltage, and an output providing a level sense signal;
   a first logic circuit that develops first and second adjust signals based on said input sense signal and said level sense signal;

an adjust circuit that provides an adjust value to adjust said plurality of adjustable reference voltages based on said first and second adjust signals and a clock input; and a second logic circuit responsive to said input sense signal, said delayed input signal, and a first clock signal to provide a second clock signal to said clock input of said adjust circuit.

8. The self adjusting reference of claim 1, wherein said comparator and adjust circuit comprises:
a comparator circuit that asserts a first signal to increase said voltage levels of said adjustable reference voltages and that asserts a second signal to decrease said voltage levels of said adjustable reference voltages; and
an adjust circuit, comprising:
a first latch responsive to said first signal to provide a first shift signal and a second latch responsive to said second signal to provide a second shift signal; and
a shift register storing a digital thermometer value, wherein said shift register shifts said thermometer value in a first direction in response to said first shift signal and shifts said digital thermometer value in a second direction in response to said second shift signal; and
wherein said adjustable voltage shifter adjusts said plurality of adjustable reference voltages based on said digital thermometer value.

9. The self adjusting reference of claim 1, wherein said comparator and adjust circuit comprises:
a comparator circuit that asserts a first signal to increase said voltage levels of said adjustable reference voltages and that asserts a second signal to decrease said voltage levels of said adjustable reference voltages; and
an adjust circuit, comprising:
a first latch responsive to said first signal to provide a first shift signal and a second latch responsive to said second signal to provide a second shift signal;
a counter that adjusts a count value in a first direction in response to said first shift signal and that adjusts said count value in a second direction in response to said second shift signal; and
a decoder that converts said count value to a digital thermometer value; and
wherein said adjustable voltage shifter adjusts said plurality of adjustable reference voltages based on said digital thermometer value.

10. A method of adjusting a voltage reference for an input buffer, comprising:
receiving a primary reference voltage and an input voltage;
providing a plurality of adjustable reference voltages based on the primary reference voltage, wherein the plurality of adjustable reference voltages includes a midway reference voltage, an upper reference voltage which is greater than the midway reference voltage, and a lower reference voltage which is less than the midway reference voltage;
comparing the midway reference voltage with the input voltage to provide an input sense signal indicative of a voltage state of the input voltage;
increasing voltage levels of the plurality of adjustable reference voltages when the input voltage is in a low voltage state and has a voltage level that is greater than the lower reference voltage; and
decreasing the voltage levels of the plurality of adjustable reference voltages when the input voltage is in a high voltage state and has a voltage level that less than the upper reference voltage.

11. The method of claim 10, wherein said providing a plurality of adjustable reference voltages comprises:
buffering the primary reference voltage to drive a first node of a resistive voltage divider to a same voltage level as the primary reference voltage;
using a voltage of a second node of the resistive voltage divider as the upper reference voltage;
using a voltage of a third node of the resistive voltage divider as the lower reference voltage; and
using a voltage of an intermediate node of a second voltage divider coupled between the second and third nodes as the midway reference voltage.

12. The method of claim 11, wherein said increasing and decreasing voltage levels of the plurality of adjustable reference voltages comprises:
adjusting a first adjustable resistor coupled between said first and second nodes of the resistive voltage divider; and
adjusting a second adjustable resistor coupled between said first and third nodes of the resistive voltage divider.

13. The method of claim 12, wherein said increasing voltage levels of the plurality of adjustable reference voltages comprises increasing resistances of the first and third adjustable resistors, and wherein said decreasing voltage levels of the plurality of adjustable reference voltages comprises decreasing the resistances of the first and third adjustable resistors.

14. The method of claim 10, further comprising:
comparing the upper reference voltage with the input voltage to provide a low sense signal;
comparing the lower reference voltage with the input voltage to provide a high sense signal;
increasing the voltage levels of the plurality of adjustable reference voltages when the input sense signal indicates that the input voltage is in a low voltage state and the high sense signal indicates that the lower reference voltage is less than the input voltage; and
decreasing the voltage levels of the plurality of adjustable reference voltages when the input sense signal indicates that the input voltage is in a high voltage state and the low sense signal indicates that the upper reference voltage is greater than the input voltage.

15. The method of claim 10, further comprising:
selecting the lower reference voltage when the input sense signal indicates that the input voltage is in a low voltage state and selecting the upper reference voltage when the input sense signal indicates that the input voltage is in a high voltage state and providing a corresponding selected reference voltage;
comparing the selected reference voltage with the input voltage to provide a level sense signal;
increasing the voltage levels of the plurality of adjustable reference voltages when the input sense signal indicates that the input voltage is in a low voltage state and the level sense signal indicates that the lower reference voltage is less than the input voltage; and
decreasing the voltage levels of the plurality of adjustable reference voltages when the input sense signal indicates that the input voltage is in a high voltage state and the level sense signal indicates that the upper reference voltage is greater than the input voltage.

16. The method of claim 10, further comprising:
delaying the input sense signal based on a clock signal and providing a delayed input signal;
selecting the lower reference voltage when the delayed input signal indicates a low voltage state and selecting the upper reference voltage when the delayed input signal indicates delayed input signal a high voltage state and providing a corresponding selected reference voltage;

comparing the selected reference voltage with the input voltage to provide a level sense signal;

increasing the voltage levels of the plurality of adjustable reference voltages when the input sense signal and the delayed input signal indicate different voltage states and the level sense signal indicates that the lower reference voltage is less than the input voltage; and decreasing the voltage levels of the plurality of adjustable reference voltages when the input sense signal and the delayed input signal indicate different voltage states and the level sense signal indicates that the upper reference voltage is greater than the input voltage.

17. The method of claim 10, wherein said increasing and decreasing the voltage levels of the plurality of adjustable reference voltages comprises updating an adjust value.

18. The method of claim 17, wherein said updating an adjust value comprises shifting a digital thermometer value.

19. The method of claim 17, wherein said updating an adjust value comprises:
   incrementing or decrementing a digital count value; and
   converting the digital count value into a digital thermometer value.

20. The method of claim 10, further comprising using the midway voltage level as a primary reference voltage for a second input buffer.

* * * * *